United States Patent [19]

Gebara

[11] Patent Number: 5,294,894
[45] Date of Patent: Mar. 15, 1994

[54] METHOD OF AND APPARATUS FOR STARTUP OF A DIGITAL COMPUTER SYSTEM CLOCK

[75] Inventor: Ghassan R. Gebara, Spring, Tex.

[73] Assignee: Compaq Computer Corporation, Houston, Tex.

[21] Appl. No.: 956,652

[22] Filed: Oct. 2, 1992

[51] Int. Cl.[5] ............................................. H03L 7/095
[52] U.S. Cl. ...................................... 331/1 A; 331/25; 331/27; 331/74; 331/DIG. 2; 364/DIG. 1; 364/270; 395/550
[58] Field of Search ...................... 331/1 A, 25, 27, 74, 331/75, DIG. 2; 364/270-271.9; 395/550

[56] References Cited

U.S. PATENT DOCUMENTS 4,310,804  1/1982  Ryon .................................. 331/1 A

OTHER PUBLICATIONS

*Electronics Engineers' Handbook*, 3rd ed. New York, McGraw-Hill Book Company, 1989, pp. 3-39; 3-42; 8-66; 13-13 through 13-16; 14-20 through 14-25; 22-25 through 22-26.
*McGraw-Hill Encyclopedia of Science & Technology*, 5th ed. New York, McGraw-Hill Book Company, pp. 134-136.
"The RCA COS/MOS Phase-Locked-Loop A Versatile Building Block for Micro-Power Digital and Analog Applications" in: *RCA COS/MOS Integrated Circuits*, 1978, RCA Corporation, pp. 598-601.

*Primary Examiner*—Siegfried H. Grimm
*Attorney, Agent, or Firm*—Pravel, Hewitt, Kimball & Krieger

[57] ABSTRACT

A method of starting up a system clock that has been generated by a phase-locked loop, and circuitry for accomplishing that method. A low frequency master clock signal is distributed to circuits that generate high frequency local clock signals. These circuits generate the high frequency local clock signals using phase-locked loops in a frequency multiplier configuration. Lock indicator circuitry determines when the phase-locked loop has locked onto the master clock signal and then enables output buffers that then provide the high frequency clock signals to components in the system which need those local clocks.

8 Claims, 8 Drawing Sheets

METHOD OF AND APPARATUS FOR STARTUP OF A DIGITAL COMPUTER SYSTEM CLOCK

BACKGROUND OF THE INVENTION

1. Field of the Invention

The invention relates to computer clocking systems, and more particularly, to methods of starting up computer clocking systems that use phase-locked loops to generate local system clock signals from master clock signals. The invention further relates to devices for realizing such methods.

2. Description of the Related Art

In efforts to realize greater computing power, microprocessor developers have continuously pushed the clock speeds ever higher. As few as ten years ago, microprocessor clock frequencies of 16 MHz were rare. Today, one sees microprocessors running at frequencies of 50 MHz and even higher.

With these higher clock frequencies have come concurrent problems. Distribution of a 50 MHz clock to the various components of a digital computer system can present difficulties associated with electromagnetic interference (EMI), clock skew, and reflections of the higher harmonics of the system clock signal. Transmission of high frequency clock signals over connectors to companion boards exacerbates these problems.

Developers have sought creative solutions to these problems. One approach has been to rely on a lower frequency system clock, and then generate, on the microprocessor or peripheral chip itself, a higher frequency clock signal from that lower frequency system clock. A number of current microprocessors and peripheral chips implement such a technique, for example, the 80486DX2 by Intel Corporation. This technique has the advantage of increasing a chip's internal processing rate without requiring a corresponding increase in system clock frequency, thus avoiding the problems associated with those higher clock rates.

Figure 1:
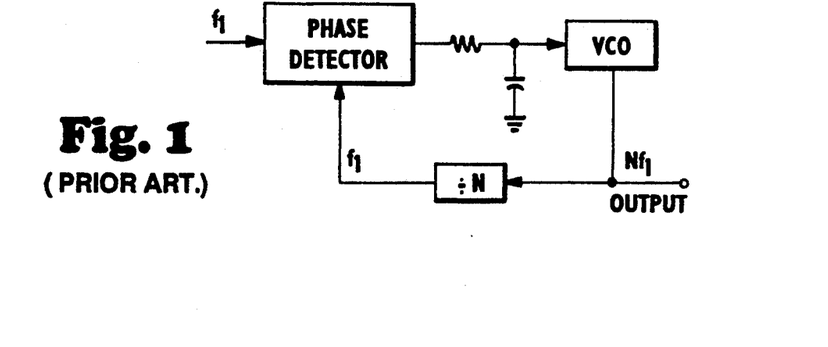
FIG. 1 is a prior art block diagram of a phase-locked loop configured as a frequency multiplier.

To generate these higher frequency internal clock signals, these chips typically use a phase-locked loop (PLL) configured as a frequency multiplier. A block diagram of such a frequency multiplier circuit is shown in FIG. 1. As is shown, a phase detector (or phase comparator) drives, through a filter, a voltage controlled oscillator (VCO). The output of that VCO, which becomes the output signal, is then divided by the desired multiplication factor, and then the phase detector compares that divided reference signal with the input signal. This feedback arrangement compensates for shifts in the phase and frequency of the input signal by a level shift to the VCO, and the output signal is thus synchronized to the input signal. Examples of PLLs that can be configured as frequency multipliers include the CD4046A by RCA Corporation and the 74LS297.

The phase detector has two main purposes. First, it forces the VCO to shift frequencies when the reference signal and the input signal are of different frequencies. Second, it forces slight corrections to the VCO output when the reference and input signals are of the same frequency but are slightly out of phase. Both of these functions are accomplished by adjusting the frequency of the VCO; it is simply a difference of the magnitude of the adjustment.

A lock-in detection circuit can also use the output of the phase detector to determine when the PLL is locked onto the input signal. Phase-locked loops and lock-in detectors are well known to those skilled in the art of electronics design. Further information can be found in "The RCA COS/MOS Phase-Locked-Loop: A Versatile Building Block for Micro-Power Digital and Analog Applications." in: RCA COS/MOS Integrated Circuits (1978), pp. 598-601, which is incorporated herein by reference.

A PLL, however, has certain characteristics that can cause their own problems. Before an input signal is applied to a PLL, its VCO runs unrestricted at a frequency known as the free running frequency. The free running frequency is typically much higher than the frequency at which the PLL will ultimately lock. In fact, the signal initially output by the unlocked PLL may be higher than what would be allowed by the system in which the PLL is to be used. Thus, at system startup, any circuit using a PLL must take this free running frequency into account.

Further, when an input signal is first provided to a PLL, the reference signal does not instantaneously lock onto that input signal. A delay known as the capture time must pass before the PLL locks. The exact length of this delay is variable, but typically the output signal will become stable after a certain maximum delay.

Microprocessors and their support chips typically have minimum and maximum allowable clock input frequencies. Driving these chips at clock frequencies outside their specifications is not only logically unpredictable, but can also physically damage these devices. Thus, if a microprocessor is rated for a 50 MHz clock rate, driving that microprocessor at 100 MHz, for example, could destroy the microprocessor. In integrated circuits using CMOS and related technology, power consumption, and thus thermal heating, is proportionally related to the clock frequency. Thermal breakdown can thus be a failure mode for driving a chip beyond its rated clock frequency.

Another problem with PLLs is that as they attempt to lock onto the input signal, their output signals can change rapidly. Many microprocessors and peripheral devices cannot accommodate such rapid fluctuations of input clock frequencies. For example, using the Intel 80486-50, the maximum allowable fluctuation in clock period for adjacent clock cycles is 0.1%, or 20 picoseconds.

So, if a PLL is used to generate a system clock, it would be desirable to prevent such a circuit from outputting a clock signal of a frequency that is outside the rated parameters of the integrated circuits that will be driven by this generated clock. Further, it would be desirable for such a circuit to avoid outputting a clock signal whose frequency is rapidly changing. Such techniques would be particularly important when the system is first started up.

SUMMARY OF THE INVENTION

The method of clock startup according to the invention uses a relatively low frequency master clock signal that is distributed to various boards of a digital computer system. A number of identical clock generation integrated circuits, constructed according to the principles of the invention, then generate the local clock signals needed by the various components of the digital computer system. These clock generation chips are typically located near those components that require the higher frequency clocks.

The clock generation chips use PLLs to generate the local clock signals. The PLLs can be configured as frequency multipliers, in which case the frequencies of the local clock signals will be a multiple of the master clock frequency. These PLLs generate the highest required frequency clocks, and then dividers generate other, lower speed, required clock signals from that high frequency clock signal. These various clock signals are then driven to the various components that need them.

At startup, the output of the PLL will be at the VCO's free running frequency. This free running frequency and the correspondingly generated clocks may be of higher frequencies than allowed by the various components of the system. Further, as the PLL locks in, the VCO output may change frequency at a rate greater than that allowed by the various components.

To prevent such high frequency and unstable signals from being driven to these components, the clock generation chips disable their clock outputs until the PLL has locked onto the master clock signal. These chips accomplish this by connecting a counter in a lock indicator circuit to the output of the phase detector in the PLL. While the PLL is unlocked, the phase detector indicates an unlocked or out-of-phase condition, so the counter is reset. When the PLL locks, the phase detector so indicates, and the counter starts running.

When the counter reaches a certain predetermined count, the lock indicator circuit enables the clock outputs of the clock generation chip. The counter thus enables these outputs a predetermined delay after the phase detector indicates that the PLL is locked in. This ensures that the output signal is locked in and stable before the clock outputs are enabled to the various devices, thus preventing those devices from trying to lock onto exceedingly high or unstable clock signals.

BRIEF DESCRIPTION OF THE DRAWINGS

A better understanding of the present invention may be obtained when the detailed description of the preferred embodiment is considered in conjunction with the following drawings, in which.

DETAILED DESCRIPTION OF THE PREFERRED EMBODIMENT

Figure 2:
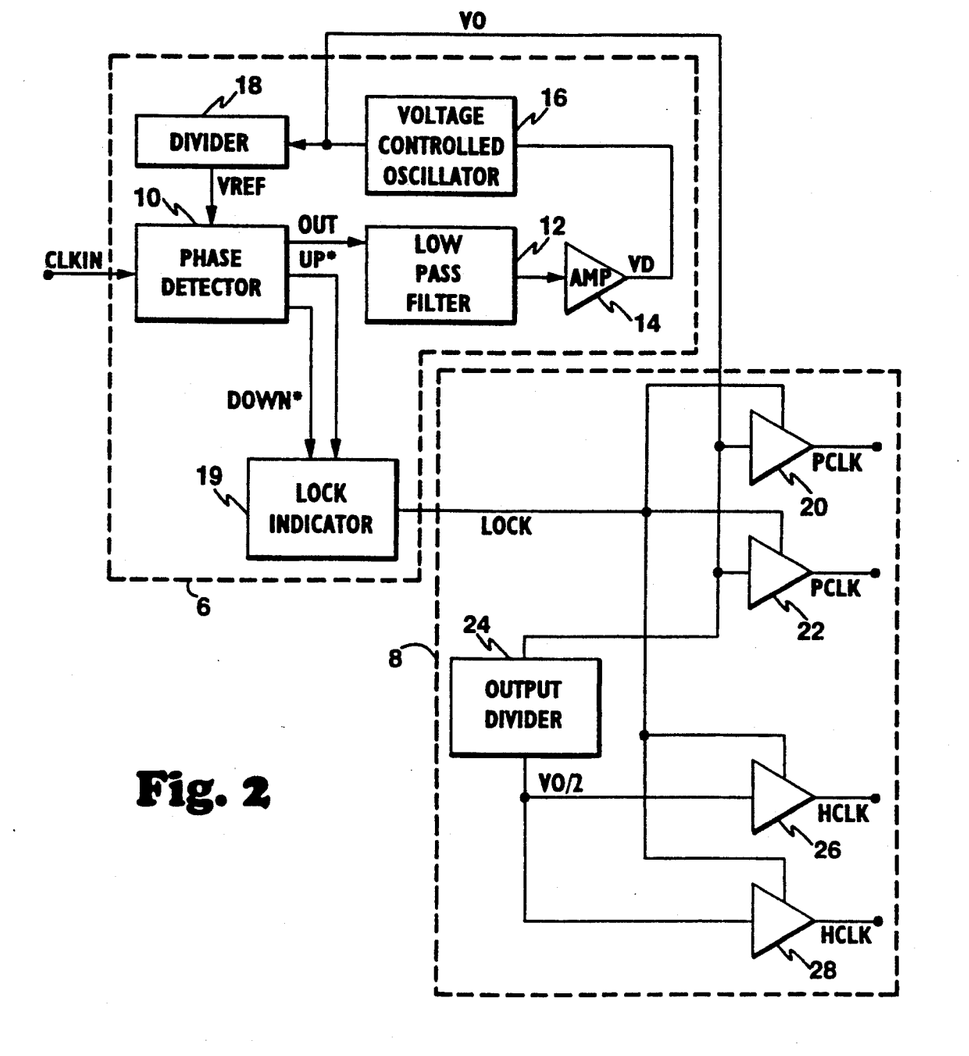
FIG. 2 is a block diagram showing the elements of a phase-locked loop based clock generation circuit along with its startup elements according to the invention.

Turning to the drawings, FIG. 2 shows a block diagram of the circuit elements of an integrated circuit constructed according to the invention. The diagram in FIG. 2 shows PLL circuitry 6 and output circuitry 8.

As an input, the signal CLKIN is provided as a master clock signal. The frequency of CLKIN is of course arbitrary, but in this embodiment is 12.5 MHz. CLKIN will typically be a square wave, but could be any periodic signal that can drive a PLL, such as a sine wave. A sine wave would typically be first passed through a buffer to convert it into a square wave.

The signal CLKIN is provided to a phase detector 10. The phase detector 10 can be constructed in a variety of ways; the circuit used in this embodiment is described later in the discussion of FIG. 5. In this embodiment, the phase detector 10 provides two signals, UP* and DOWN*. The signals UP* and DOWN* are filtered through a low pass filter 12, and then driven into an amplifier 14. The amplifier 14 provides a control voltage VD to a voltage controlled oscillator (VCO) 16, which generates a square wave signal VO. VO is then divided by a divider 18. The divider 18 can conceivably divide VO by any integral value, but in this embodiment divides the signal VO by four. This divided signal then becomes the reference signal VREF, which is fed back as a reference input signal into the phase detector 10.

In operation, the phase detector 10, low pass filter 12, amplifier 14, VCO 16, and divider 18 form a PLL configured for frequency multiplication. When the PLL is locked, the output signal VO is in phase with CLKIN, and is an integral multiple of the frequency of CLKIN. In this embodiment VO is a 50 MHz square wave, as CLKIN is a 12.5 MHz signal.

Also associated with the PLL circuitry 6 is a lock indicator 19. The lock indicator 19 is driven by the UP* and DOWN* signals from the phase detector 10, and is described later in the discussion of FIG. 6. When the lock indicator 19 determines that the phase detector 10 indicates that the PLL circuitry 6 is locked onto CLKIN, the lock indicator 19 delays for an arbitrary amount of time and then asserts an active high lock indication signal LOCK. This delay ensures that the PLL circuitry 6 has locked in on CLKIN, that CLKIN is stable, and that the PLL circuitry is stable. When the lock indicator 19 asserts LOCK true, or high, the output circuitry 8 becomes active. At all times, VO drives the inputs of high frequency output buffers 20 and 22. The high frequency output buffers 20 and 22 are tri-state buffers and are disabled and enabled by the signal LOCK. When LOCK is asserted high, the high frequency output buffers 20 and 22 are switched from a tri-state condition to an enabled condition. The high frequency output buffers 20 and 22 are then driving the signal VO as their output signal PCLK. Of course, as few or as many output buffers as desired can be added to this design.

The signal VO is also divided by the output divider 24. This is a divide-by-two divider, and can be a flip-flop, for example. The output divider 24 provides a divided output signal VO/2, which is input to low frequency output buffers 26 and 28, which are also tri-state buffers. These buffers 26 and 28 are enabled and disabled by LOCK in the same way as the high frequency output buffers 20 and 22.

Figure 3:
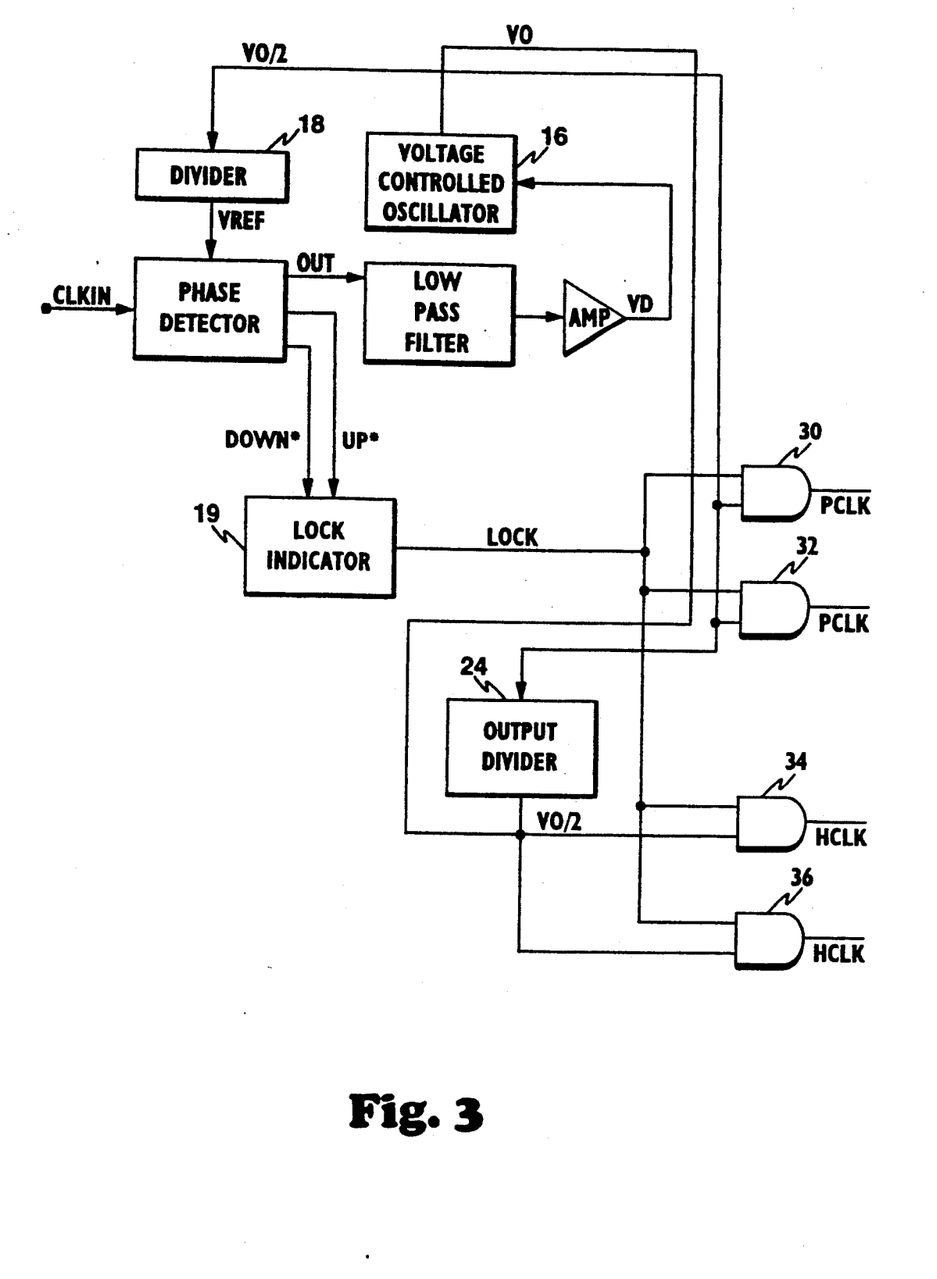
FIG. 3 is a block diagram showing an alternative embodiment to FIG. 2.

FIG. 3 shows an alternative embodiment of the block diagram of FIG. 2. FIG. 3 shows two principal differences from the previous diagram. First, high frequency AND gates 30 and 32 and low frequency AND gates 34 and 36 replace the high frequency output buffers 20 and 22 and the low frequency output buffers 6 and 28 of FIG. 2. The lock indicator 16 provides LOCK as one input to these AND gates 30, 32, 34 and 36, and thus when LOCK is low, the outputs of the AND gates 30, 32, 34 and 36 are low. When LOCK is high, the PCLK signal output from the high frequency AND gate outputs 30 and 32 tracks the signal VO, and thus is 50 MHz. Similarly, when LOCK is high, the HCLK signal out of the low frequency AND gate outputs 34 and 36 tracks VO/2, and thus is 25 MHz.

The second difference between FIG. 3 and FIG. 2 is that the signal VO/2, rather than the signal VO, is provided to the divider 18. This allows the lower frequency signal HCLK to be synchronized with the rising edge of CLKIN. In this configuration, the divider 18 divides by two rather than four, so that VREF is 12.5 MHz when VO is 50 MHz.

Of course one skilled in the art would recognize other ways to implement the outputs and the feedback in the PLL circuitry 6 and the output circuitry 8.

Figure 4:
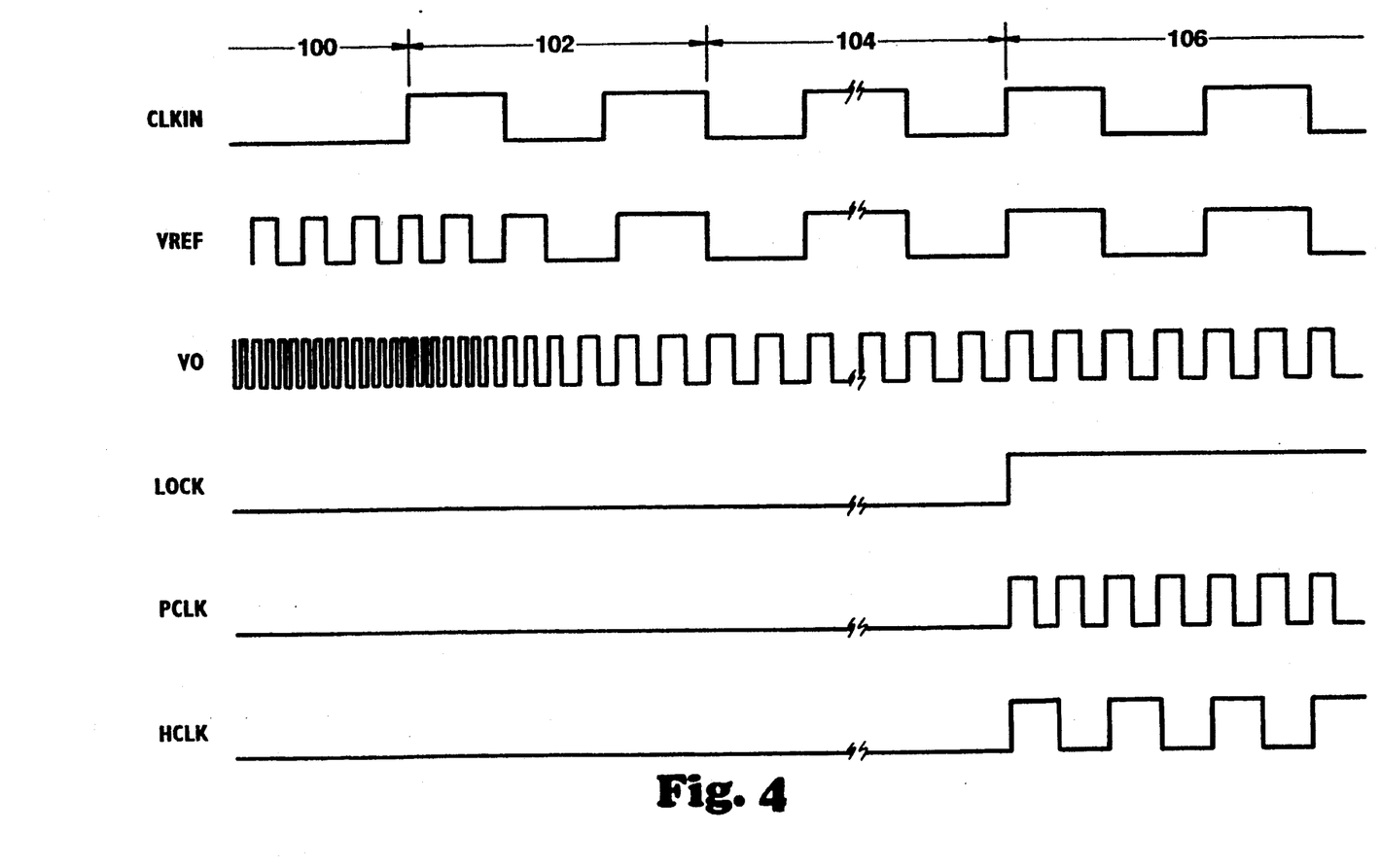
FIG. 4 is a timing diagram showing typical signals generated by a circuit built according to the block diagram in FIG. 2.

FIG. 4 shows a timing diagram of the various signals associated with the block diagram of FIG. 2. This timing diagram is divided into four distinct time periods: a power-on period 100, an acquisition period 102, a delay period 104, and a lock period 106. During the power-on period 100, the signal CLKIN has not yet been provided by the external circuitry, but power has been supplied to the system. At this point, the signal VO runs at the free running frequency of the VCO 16. In this embodiment, that frequency is approximately 200 MHz. As VREF is VO divided by four, VREF will be running at approximately 50 MHz. LOCK is low and thus disables the high frequency output drivers 20 and 22 and the low frequency output drivers 26 and 28. As these drivers respectively provide the signals PCLK and HCLK, those signals are kept at a tri-state level (here shown low, as being pulled down by external circuitry, for example parallel termination).

During the acquisition period 102, CLKIN is being provided by the external system. Here, CLKIN is a 12.5 MHz clock. When CLKIN is provided, the PLL circuitry 6 attempts to lock onto the CLKIN signal. This is shown as occurring in one and one-half cycles of CLKIN, but in actual practice this lock-in can take more or less time. During the acquisition period 102, VREF slows from its initial rate of 50 MHz to 12.5 MHz and VO slows from its initial rate of 200 MHz to 50 MHz. At the end of the acquisition period 102, the phase detector 10 indicates to the lock indicator 19 that the PLL circuitry 6 is locked-in.

The lock indicator 19 then provides a delay shown as the delay period 104. This is an arbitrary length of time, but for this embodiment is 10 milliseconds. If the phase detector 10 indicates for 10 milliseconds that lock-in has been maintained, then the PLL circuitry 6 and the master clock signal CLKIN should be stable. If, during the delay period 104, the phase detector 10 at any time indicates that the PLL circuitry 6 has gone out of lock, then the lock indicator 19 resets and begins a new 10 millisecond period.

After the delay period 104, the system enters the lock period 106. The lock indicator 19 asserts the signal LOCK, and that signal then enables the high frequency output buffers 20 and 22, which then provide the 50 MHz signal VO as PCLK, and enables the low frequency output buffers 26 and 28, which then provide the 25 MHz signal VO/2 as HCLK. VREF is then running synchronized to CLKIN at 12.5 MHz.

If the LOCK signal were not provided to enable and disable the high frequency output buffers 20 and 22 and the low frequency output buffers 26 and 28, then those signals would run from the time the system was turned on. In that case, the high frequency output buffers 20 and 22 would initially output a 200 MHz signal as PCLK, and the low frequency output buffers 26 and 28 would output a 100 MHz signal HCLK. As will be later described, these signals can be provided to a microprocessor and its peripheral components, and these signals could be outside the specified running clock frequencies for those microprocessors and components.

DIGITAL PHASE DETECTOR

Figure 5:
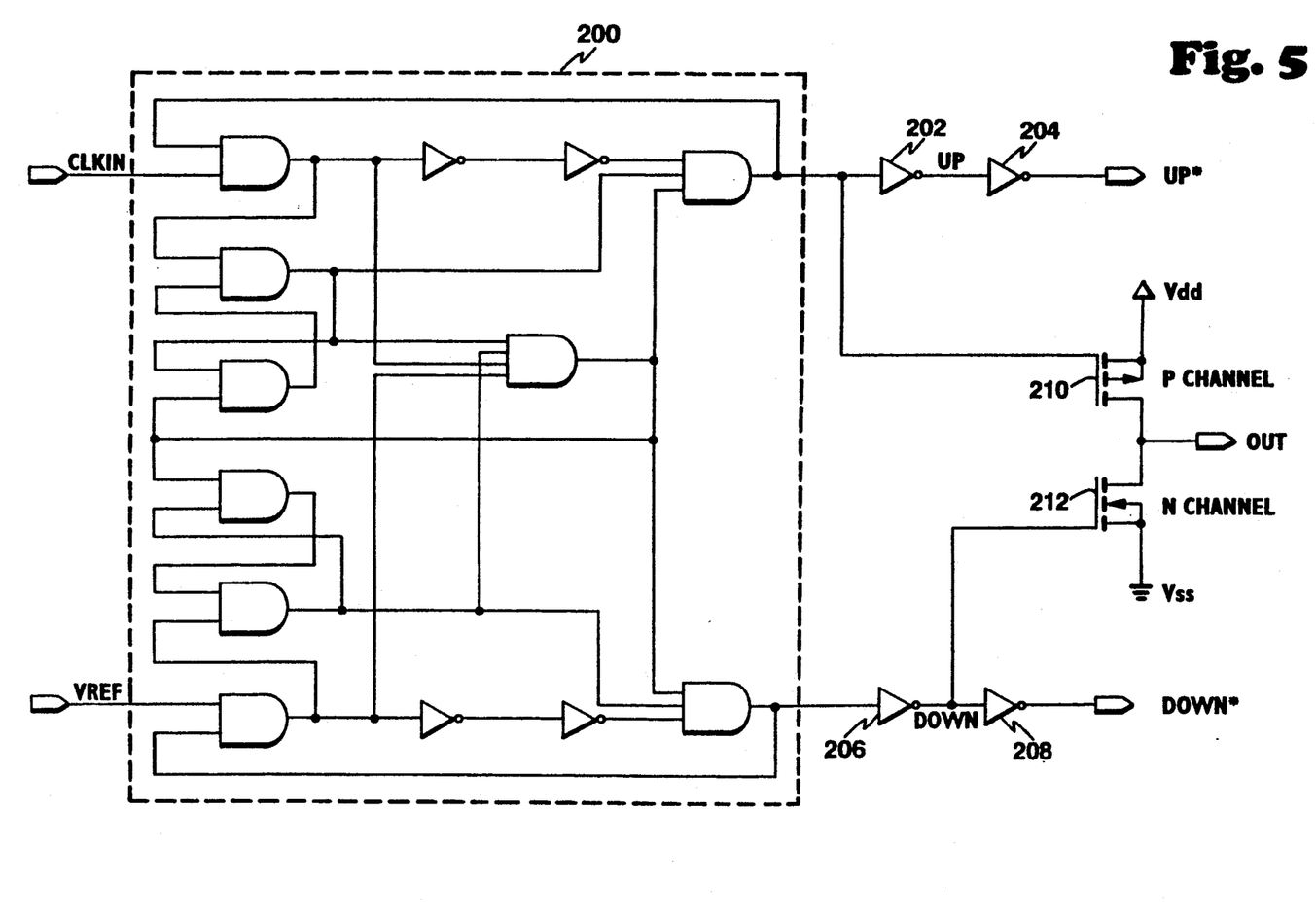
FIG. 5 is a schematic of a typical delay circuit used in the lock indicator of a circuit built according to the block diagram in FIG. 2.

FIG. 5 shows a schematic for the phase detector 10 as used in this embodiment. A variety of circuits could be used, but the particular circuit shown in FIG. 5 has the advantages of not being dependent upon the duty cycles of CLKIN and VREF, and the advantage of providing for a very small phase shift between CLKIN and VREF. In the circuit of FIG. 5, CLKIN and VREF are provided as input signals to digital phase detection circuitry 200, which provides, through inverters 202, 204, 206 and 208, the output signals UP* and DOWN*. When the frequency of CLKIN is greater than the frequency of VREF, UP* goes continuously low, or true. Conversely, when the frequency of CLKIN is less than the frequency of VREF, DOWN* goes continuously low, or true. If the frequencies of CLKIN and VREF are the same, but CLKIN lags VREF, then DOWN* is maintained low for a time corresponding to the phase difference. Conversely, if CLKIN leads VREF, then UP* is maintained low for a period corresponding to the phase difference.

An OUT signal is used to drive the low pass filter 12. OUT can be generated by a push-pull pair of MOSFETs. The gate of a p-channel MOSFET 210 is driven by the UP* signal, while its source is connected to Vdd. The gate of an n-channel MOSFET 212 is driven by the DOWN signal, while its source is connected to ground. The drains of both MOSFETS 210 and 212 are tied together, and provide the signal OUT. When UP* goes low, a p-channel MOSFET 210 turns on, driving OUT to Vdd. When DOWN goes high, the n-channel MOSFET 212 turns on, driving OUT to ground. When neither UP nor DOWN is true, OUT is in a high impedance state. Other circuits could be used to convert the two DOWN* and UP* signals to the single OUT signal. OUT is filtered through the low-pass filter 12 and the resulting filtered signal driven into the amplifier 14. The amplified signal then adjusts the VCO 16 to maintain VREF and CLKIN at the same frequency and phase.

LOCK INDICATOR

Figure 6:
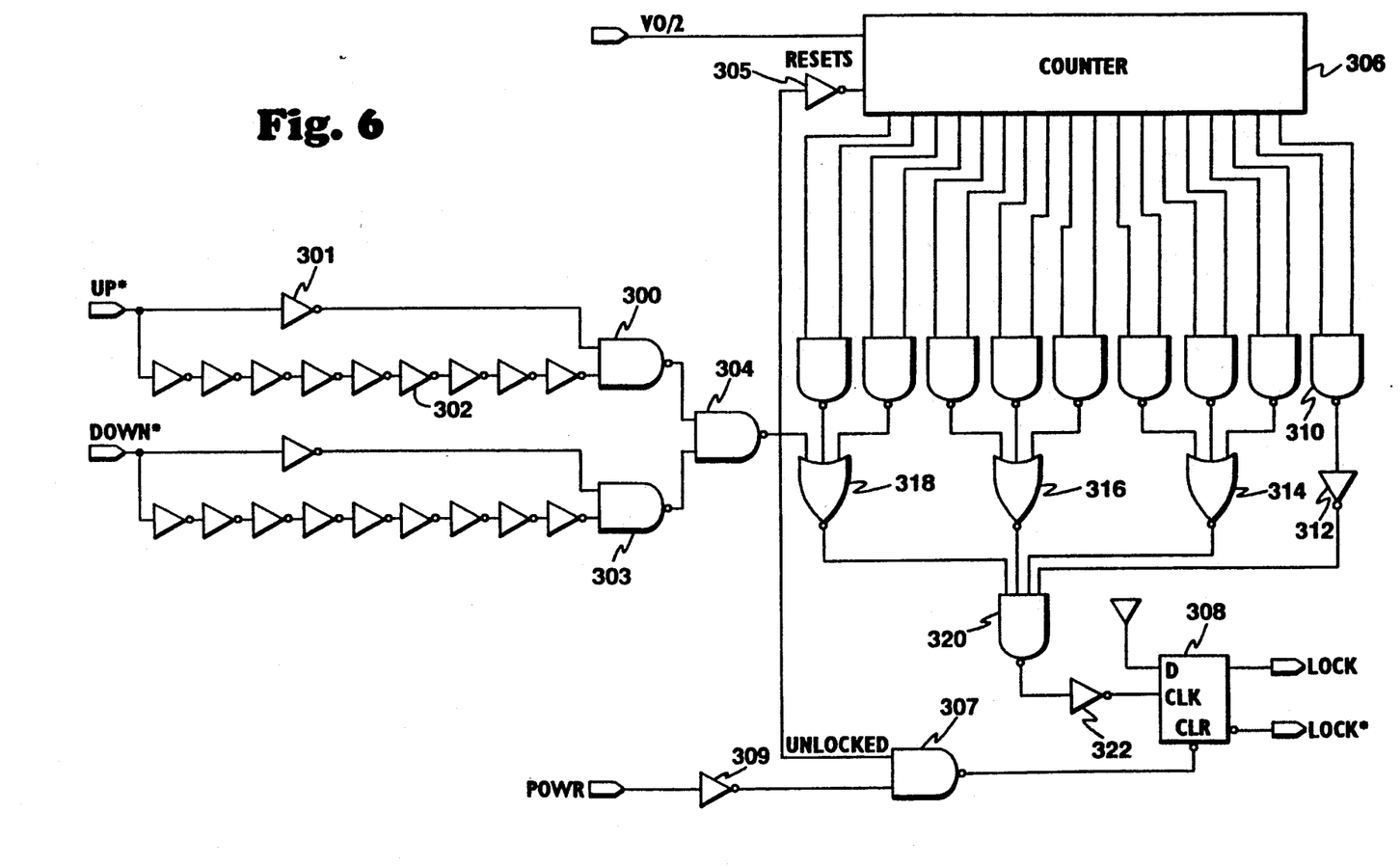
FIG. 6 is a schematic of a typical digital phase detector used in a circuit built according to the block diagram in FIG. 2.

FIG. 6 shows a schematic of the circuitry used to implement the lock indicator 19. As inputs, FIG. 6 uses the signals UP* and DOWN* provided by the phase detector 10, as shown in FIG. 5. When UP* goes low, or true, a high signal goes to one input of a NAND gate 300 via an inverter 301 and the active low UP* signal also goes through a series of inverters 302. The series of inverters 302 functions as a delay line to the NAND gate 300 so that very narrow UP* signal pulses are filtered. These pulses are those generated by the phase detector 10 in normal operation to adjust for slight drifts in the phase of VREF. Thus, only when UP* goes low for a period of time long enough for that low signal to traverse the series of inverters 302 will the output of the NAND gate 300 go low, or true. The DOWN* signal uses corresponding circuitry. When the output of the NAND gate 300 goes low, that indicates that the PLL is no longer in lock. So, the output of a second NAND gate 304, which receives the outputs of the NAND gate 300 and the corresponding NAND gate 303 in the DOWN* circuitry, correspondingly goes high. The output of the NAND gate 304 is the UNLOCKED signal, which is provided to an inverter 305 and one input of a NAND gate 307. The inverter 305 has its output connected to the inverted clear input of a counter 306. The second input of the NAND gate 307 is connected to the output of an inverter 309, which receives the POWR or power-on reset signal at its input. This signal stays high until Vdd rises to an arbitrary voltage level, here being 2.0 volts. The output of the NAND gate 307 is connected to the inverted clear input of a flip-flop 308. So when the output of NAND gate 304 is high, the counter 306 is cleared and the flip-flop 308 is cleared after the reset period.

When UP* and DOWN* are once again both high, and thus the PLL is locked, then the NAND gate 304 output is low, and the counter 306 begins counting. The clock for the counter 306 is VO/2, which runs at 25 MHz. The counter 306 has 18 stages going into a series of 9 two input NAND gates 310. When all 18 lines of the counter 306 are true, the series of NAND gates 310 outputs are all low. The output of one NAND gate 310 is inverted by an inverter 312 and provided as one input to a NAND gate 320. The outputs of three NAND gates 310 are provided to the inputs of a NOR gate 314, whose output is connected to the NAND gate 320. The outputs of three more NAND gates 310 are provided to the inputs of a NOR gate 316, whose output is also connected to NAND gate 320. The final two NAND gates 310 are connected to inputs of a NOR gate 318. The third input of the NOR gate 318 receives the UNLOCKED signal from the NAND gate 304. The output of the NOR gate 318 is the final input to the NAND gate 320. The output of the NAND gate 320 is inverted by an inverter 322, whose output is connected to the clock input of the flip-flop 308. The D input of the flip-flop 308 is connected to a logic high level. The noninverted and inverted outputs of the flip-flop 308 are the LOCK and LOCK* signals, respectively.

As the counter 306 counts up and all the outputs are true and the PLL is still locked, the flip-flop 308 is clocked and the LOCK signal goes true. If lock is lost for greater than a minimal period, then the counter 306 and the flip-flop 308 are cleared and the LOCK signal goes false. The counter 306 thus provides a lock delay period of approximately 10 milliseconds.

DETAILS OF THE EMBODIMENT

Figure 7:
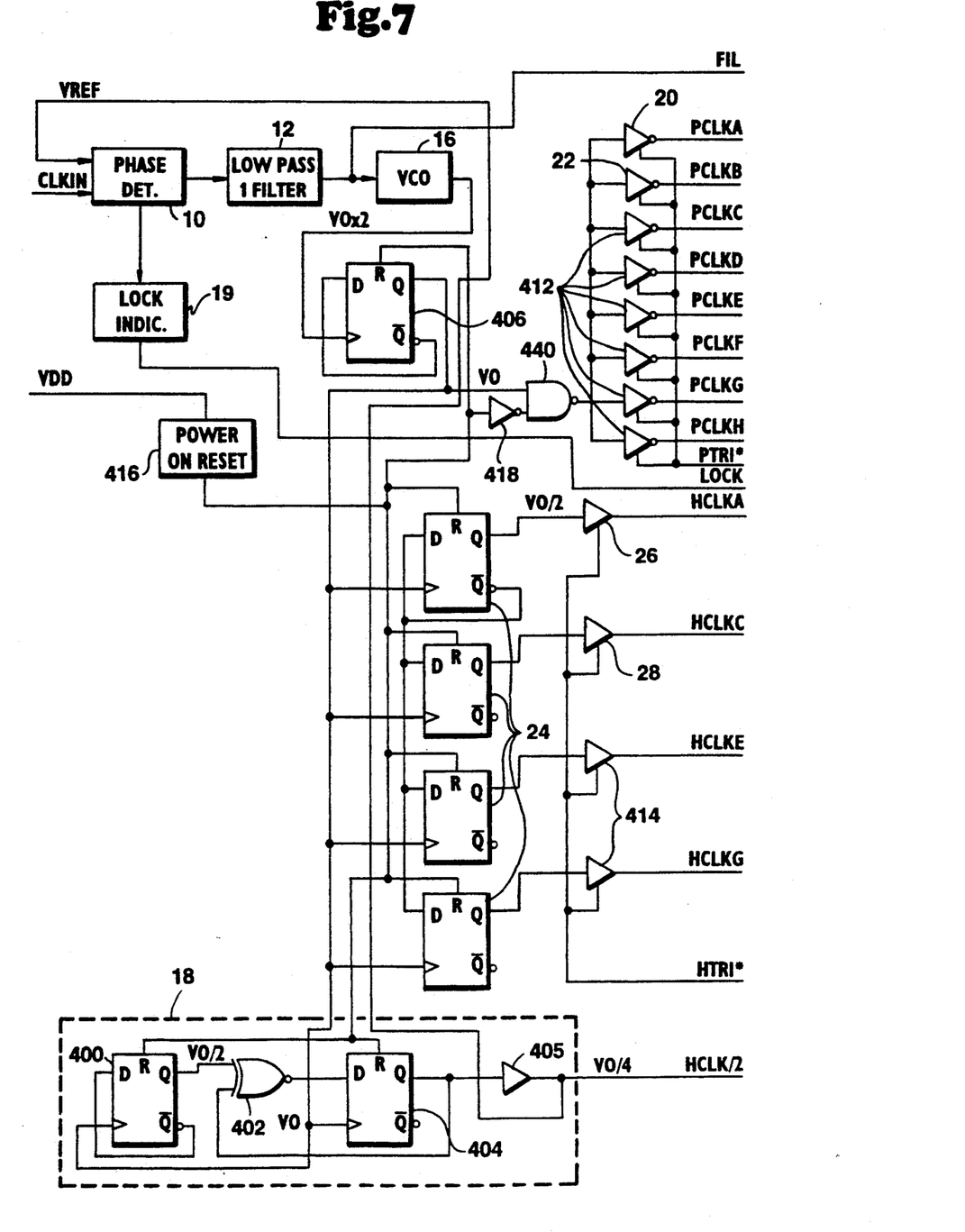
FIG. 7 is a combination schematic and block diagram of an integrated circuit constructed according to the invention used to generate high frequency local clocks from a master clock signal.

FIG. 7 shows a schematic of portions of the internal circuitry of an integrated circuit actually implemented according to the invention. Shown are the phase detector 10, the low-pass filter 12, the VCO 16, the divider 18, the lock indicator 19, and the output divider 24.

Also shown are the high frequency output buffers 20 and 22 and the low frequency output buffers 26 and 28. The enables for the high frequency output buffers 20 and 22 are driven by the signal PTRI*. Similarly, the enables for the low frequency output buffers 26 and 28 are driven by the signal HTRI*. These inputs are active high in the sense that the outputs are enabled when PTRI* and HTRI* are high and tri-stated when the signals PTRI* and HTRI* are low.

The divider 18 is shown, being made up of a first D flip-flop 400, an inverting output XOR gate 402, a second D flip-flop 404, and a driver 405. The first D flip-flop 400 has as its clock input the signal VO. The inverting output of the first D flip-flop 400 is tied to its D input. Thus, the signal out of the first D flip-flop 400 is VO/2. The noninverting output of the first D flip-flop 400 is connected to one input of the inverting output XOR gate 402. The other input is connected to the noninverting output of the second D flip-flop 404. The output of the inverting output XOR gate 402 is connected to the D input of the second D flip-flop 404. The noninverting output of the second D flip-flop 404 is also connected to a driver 405. The output of the driver 405 is the signal VO/4 and becomes the reference input VREF of the phase detector 10.

In FIG. 7, an additional divider 406 is provided between the output of the VCO 16 and the line carrying the signal VO. Thus, for VO to be a 50 MHz signal, for example, the VCO 16 must generate VO times two, which is a 100 MHz signal.

The output of the additional divider 406 then becomes the signal VO and drives the high frequency output buffers 20 and 22, as well as additional high frequency buffers 412, through a NAND gate 410. The output of the additional divider 406 also drives the low frequency output buffers 26 and 28, as well as additional low frequency buffers 414, through the output divider 24, which here is a series of D flip-flops, one for each output. The output of the additional divider 406 drives the clock of each flip-flop making up the output divider 24. One inverting output of this series of D flip-flops making up the output divider 24 is tied to the D input of each flip-flop. The non-inverting outputs then are connected to the low frequency output buffers 26 and 28, as well as additional low frequency buffers 14.

Power-on reset circuitry 416 detects when Vdd goes on, and then drives an active high RESET signal to the reset input of the additional divider 406, an input of the NAND gate 410 through an inverter 418, the reset input of each D flip-flop making up the output divider 24, and the reset inputs of the first D flip-flop 400 and the second D flip-flop 404 in the divider 18. Finally, the lock indicator 19 provides the active high lock indication signal LOCK.

Figure 8:
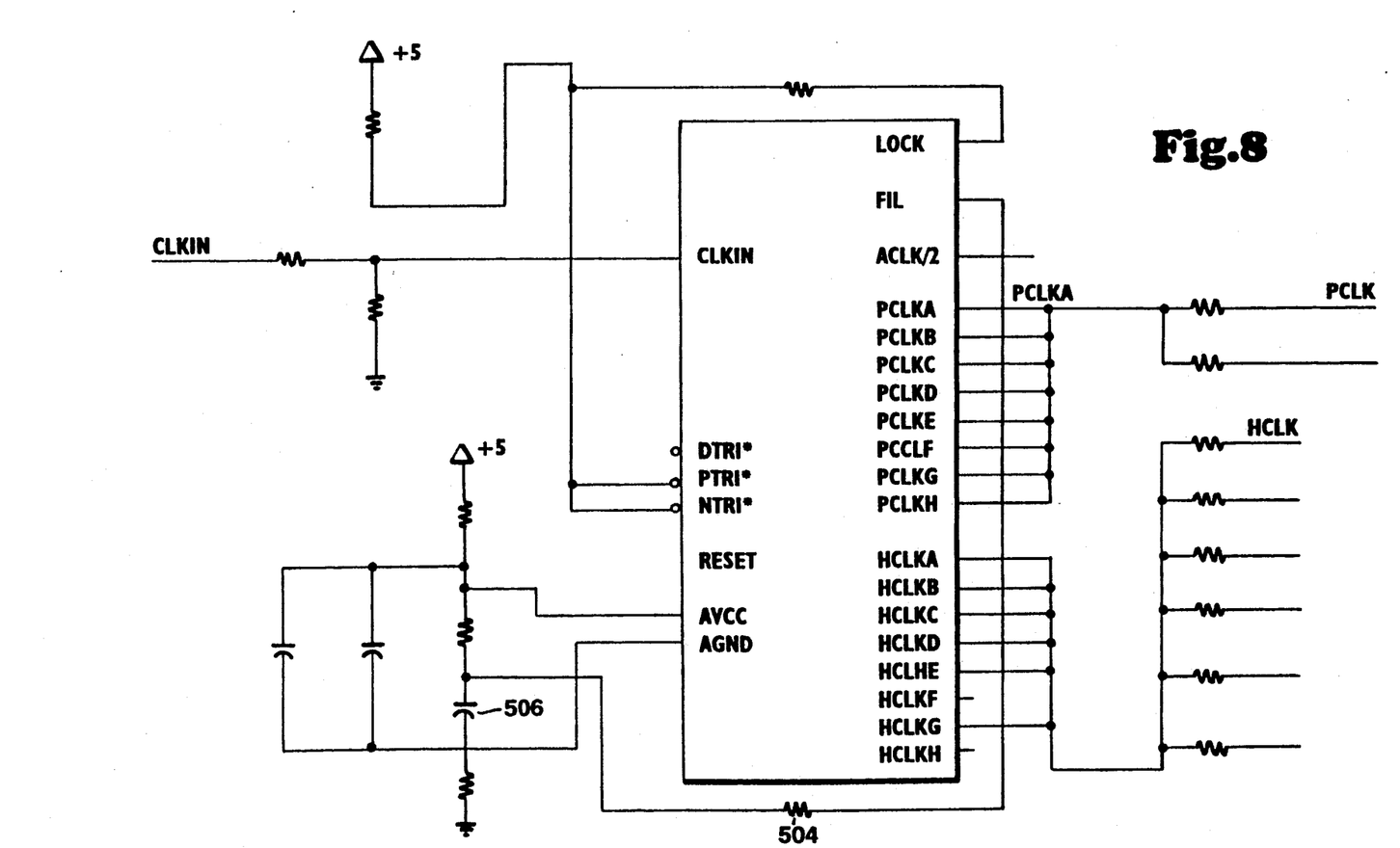
FIG. 8 is a schematic showing typical external circuitry used to drive the integrated circuit of FIG. 6.

An integrated circuit constructed according to the invention as illustrated in the schematic of FIG. 7 is configured as shown in FIG. 8 when used in a digital computer system. Specifically, CLKIN is a 12.5 MHz system clock. The LOCK output feeds into the PTRI* and HTRI* inputs of the chip. When LOCK goes high, PTRI* is driven high, which enables the high frequency output buffers 20 and 22. Similarly, HTRI* is also asserted high, enabling the low frequency output buffers 26 and 28.

Finally, the FIL line, which is part of the low-pass filter 12, goes into an RC network consisting of a resistor 504 and a capacitor 506. This RC network assists in converting the digital OUT signal output by the phase detector 10 to an analog signal suitable for input to the VCO 16.

Figure 9:
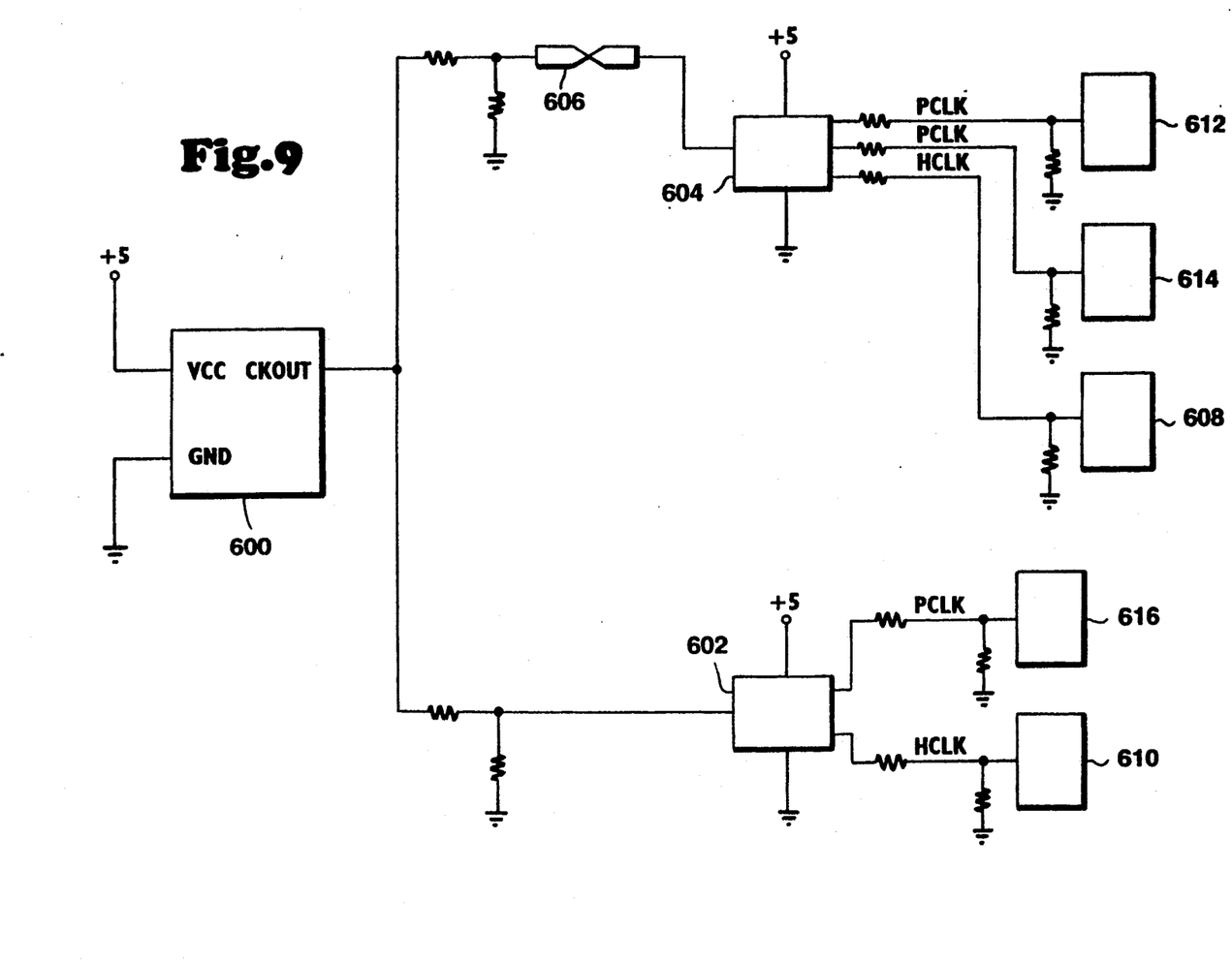
FIG. 9 is a schematic and block diagram showing a number of integrated circuits as shown in FIG. 6 used in a system to generate high frequency local clock signals from a lower frequency master clock signal according to the invention.

Finally, FIG. 9 shows how the integrated circuit constructed according to the invention as shown in FIG. 7 is used in a system. A master clock circuit 600 generates the 12.5 MHz system clock CLKIN. This clock is distributed to both an onboard clock generator chip 602 and an offboard clock generator chip 604, these chips being constructed according to the schematic and block diagram of FIG. 7. The offboard clock generator chip 604 is located on a separate board connected to the main system board by a connector 606.

The onboard clock generator chip 602 and the offboard clock generator chip 604 generate a 50 MHz clock signal PCLK and a 25 MHz clock signal HCLK. These signals are local clock signals for use by peripheral chips 608, 610, 612, 614 and 616. The generator chips 602 and 604 can be repeated as desired to provide local clock signals to other peripheral chips. Of course, according to the invention, these signals are tri-stated until the PLLs on the onboard clock generator chip 602 and the offboard clock generator chip 604 stabilize. FIG. 9 shows PCLK as being provided to peripheral chips 608 and 610, while HCLK is provided to peripheral chips 612, 614 and 616. Of course, the number of chips which require each frequency is arbitrary, and in fact one chip could receive both frequencies of clock signal.

The offboard clock generator chip 604 and onboard clock generator chip 602 are typically located physically near the chips that use their local clock signals. This prevents transmission line problems associated with transmitting high frequency clock signals over long traces. In a typical system, chips using the 50 MHz signal would include, for example, the 50 MHz 80486DX microprocessor and the 82495 cache controller, both by Intel Corporation. Examples of chips using the 25 MHz clock would be the 82490 cache SRAM, also by Intel. By delaying the provision of the PCLK and HCLK signals to these devices until the PLL in the clock generator chip 604 is stable, the devices do not receive a clock signal that is out of specification or rapidly changing. Thus the devices receive stable clocks and do not overheat.

This invention has been described in terms of particular embodiments. Obviously, modifications and alterations will be apparent to those skilled in the art in view of this disclosure. It is therefore intended that all such equipments, modifications, and variations fall within the spirit and scope of the invention as claimed.

I claim:

1. A method of starting a local clock signal in a digital computer system having a master clock signal, comprising the steps of:
   receiving the master clock signal;
   driving the input of a phase-locked loop with said received master clock signal, said phase-locked loop including a voltage controlled oscillator and a phase comparator;
   driving the input of an output buffer with the output of said voltage controlled oscillator;
   detecting when said phase-locked loop has locked onto said received master clock signal; and
   enabling said output buffer in response to detecting when said phase-locked loop has locked onto said received master clock signal.

2. The method of claim 1, wherein said phase-locked loop is a frequency multiplier.

3. The method of claim 1, further comprising the steps of:
   dividing the output of said voltage controlled oscillator;
   driving the input of a second output buffer with said divided output of said voltage controlled oscillator; and
   enabling said second output buffer in response to detecting when said phase-locked loop has locked onto said received master system clock signal.

4. The method of claim 1, wherein said step of detecting when said phase-locked loop has locked onto the master clock signal includes the step of monitoring instantaneous lock indications for a predetermined period of time before determining the locked condition.

5. An apparatus for providing a local system clock in a digital computer system having a master clock signal, comprising:
   a phase-locked loop including a voltage controlled oscillator having a clock signal output and an input for receiving a phase difference signal for controlling oscillation frequency; a phase detector having an input for connection to the master clock signal, an input for receiving a reference signal, and a phase difference output signal provided to said voltage controlled oscillator; and means for feeding back said voltage controlled oscillator clock signal output to said phase detector reference signal input;
   a lock indicator connected to said phase detector phase difference output and having a lock output, wherein said lock indicator drives said lock output active when said phase-locked loop is locked onto said master clock signal as indicated by said phase difference output; and
   an output buffer having an input connected to said voltage controlled oscillator clock signal output, an output for providing the local system clock and an enable input connected to said lock output to drive said input to said output when said lock output is active.

6. The apparatus of claim 5, wherein said lock indicator further includes a delay circuit which monitors said phase difference output and provides said lock output only after said phase detection output has indicated a locked condition for greater than a predetermined interval.

7. The apparatus of claim 5 wherein said phase-locked loop is a frequency multiplier.

8. The apparatus of claim 6 wherein said delay circuit includes a counter.

* * * * *